United States Patent
Priel et al.

(10) Patent No.: US 9,799,379 B2
(45) Date of Patent: Oct. 24, 2017

(54) HOLD TIME AWARE REGISTER FILE MODULE AND METHOD THEREFOR

(75) Inventors: Michael Priel, Netanya (FR); Leonid Fleshel, Hertzelia (IL); Dan Kuzmin, Givat Shmuel (IL)

(73) Assignee: NXP USA, Inc., Austin, TX (US)

( * ) Notice: Subject to any disclaimer, the term of this patent is extended or adjusted under 35 U.S.C. 154(b) by 170 days.

(21) Appl. No.: 14/415,153

(22) PCT Filed: Jul. 20, 2012

(86) PCT No.: PCT/IB2012/053721
§ 371 (c)(1),
(2), (4) Date: Jan. 16, 2015

(87) PCT Pub. No.: WO2014/013298
PCT Pub. Date: Jan. 23, 2014

(65) Prior Publication Data
US 2015/0206559 A1 Jul. 23, 2015

(51) Int. Cl.
*G06F 12/00* (2006.01)
*G11C 7/10* (2006.01)
*G11C 7/22* (2006.01)
*G11C 19/00* (2006.01)
*G11C 19/28* (2006.01)
(Continued)

(52) U.S. Cl.
CPC ............ *G11C 7/1072* (2013.01); *G11C 7/065* (2013.01); *G11C 7/1039* (2013.01); *G11C 7/22* (2013.01); *G11C 19/00* (2013.01); *G11C 19/28* (2013.01); *G11C 29/32* (2013.01); *G11C 2207/007* (2013.01)

(58) Field of Classification Search
CPC ... G11C 19/00; G11C 19/28; G11C 2207/007; G11C 29/32; G11C 7/065; G11C 7/1039; G11C 7/1072; G11C 7/22
USPC ......................................... 711/105
See application file for complete search history.

(56) References Cited

U.S. PATENT DOCUMENTS 4,916,670 A * 4/1990 Suzuki ................ G11C 7/1078
365/189.05
7,313,768 B2 12/2007 Mochizuki
(Continued)

FOREIGN PATENT DOCUMENTS

EP 0288774 B1 1/1993

OTHER PUBLICATIONS

International Search Report and Written Opinion correlating to PCT/IB2012/053721 dated Jan. 17, 2013.

*Primary Examiner* — Mardochee Chery

(57) ABSTRACT

A register file module comprising at least one register array comprising a plurality of latch devices is described. The plurality of latch devices is arranged to individually provide memory bit-cells when the register file module is configured to operate in a first, functional operating mode, and at least one clock control component is arranged to receive a clock signal and to propagate the clock signal to the latch devices within the at least one register array. The register file module is configurable to operate in a second, scan mode in which the latch devices within the at least one register array are arranged into at least one scan chain. The at least one clock control component is arranged to propagate the clock signal to the latch devices within the at least one register array such that alternate latch devices within the at least one scan chain receive an inverted form of the clock signal.

20 Claims, 3 Drawing Sheets

(51) Int. Cl.
    *G11C 29/32*     (2006.01)
    *G11C 7/06*     (2006.01)

(56) References Cited

U.S. PATENT DOCUMENTS

| | | |
|---|---|---|
| 7,430,695 B2 | 9/2008 | Tanaka |
| 7,657,807 B1 | 2/2010 | Watkins et al. |
| 2009/0240997 A1* | 9/2009 | Hasegawa ........ G01R 31/31727 <br> 714/731 |
| 2009/0249041 A1* | 10/2009 | Damaraju ........... G06F 9/30141 <br> 712/223 |
| 2010/0332929 A1* | 12/2010 | Branch .......... G01B 31/318536 <br> 714/731 |
| 2011/0095801 A1 | 4/2011 | Bjerregaard et al. |
| 2011/0241744 A1 | 10/2011 | Moudgill et al. |
| 2012/0072793 A1 | 3/2012 | Rao et al. |

\* cited by examiner

HOLD TIME AWARE REGISTER FILE MODULE AND METHOD THEREFOR

FIELD OF THE INVENTION

The field of this invention relates to a register file module and method therefor.

BACKGROUND OF THE INVENTION

Register files are popular components within modern processor and hardware accelerator designs. A register file is an array of registers typically comprising dedicated read and write ports; in contrast to ordinary memory which usually comprises shared read/write ports. Register files are typically implemented as small, high speed memory components, and are often required to enable sequential read and write operations within a single clock cycle. In order to achieve this, a register file is often tightly coupled to other components within the processor/accelerator design in order to enable such high speed access. Due to this need to tightly couple a register file to other components, standard memory circuits (typically random access memory (RAM)-based) are typically not appropriate. As such, it is known to implement a register file using a custom placed flip-flop implementation.

A problem with such a custom placed flip-flop implementation is that a standard flip-flop requires a relatively large silicon area and has relatively slow timing performance compared with simpler storage elements such as latches. However, in a gated latch implementation, input signal changes cause immediate changes in output when enabled. As such, when several latches follow each other using the same clock signal, signals can propagate through all of them at once. As such, a problem with a latch-based implementation is a need to resolve hold timing of signals in order to prevent an input signal causing an immediate change in output.

A further problem with the use of latches is in relation to a need to implement design for test functionality within modern integrated circuit devices. In particular, it is often required to enable scan design within register files, whereby registers in the design are connected in one or more scan chains. However, due to their inability to implement hold timing between latches, a latch-based implementation is typically not appropriate for enabling such scan chains.

SUMMARY OF THE INVENTION

The present invention provides a register file module and a method of enabling scan chain functionality within a register array as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

The present invention will now be described with reference to an example of a register file. For ease of understanding, the example described herein and illustrated in the accompanying drawings comprises a single register array, and a single write port and a single read port. However, it will be appreciated that the present invention may equally be applied to register file modules comprising more than one register array, more than write port and/or more than one read port. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
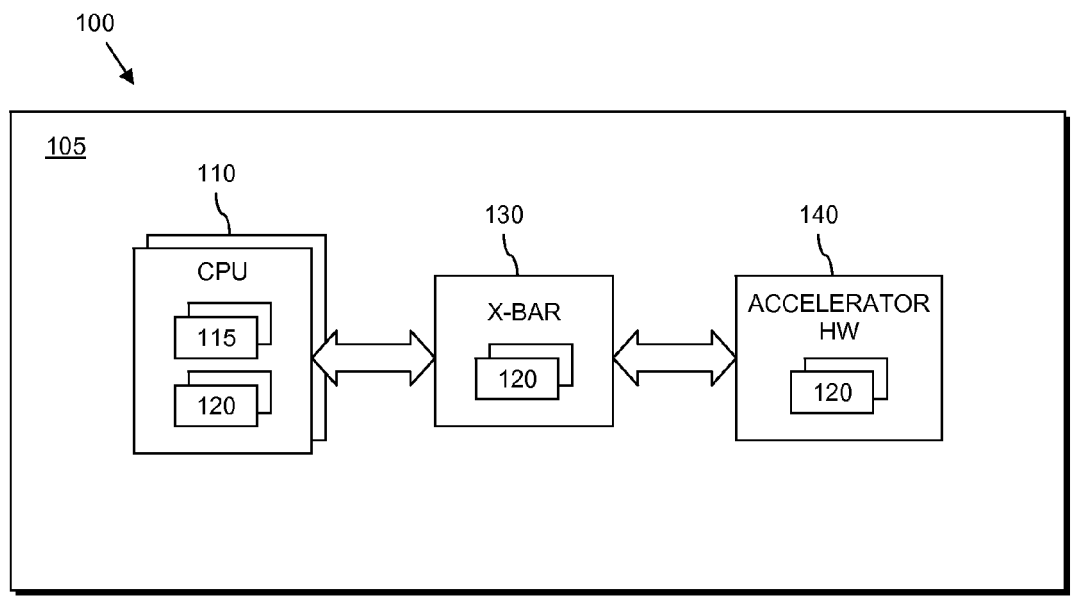
FIG. 1 illustrates a simplified block diagram of an example of a processing system.

Referring first to FIG. 1, there is illustrated a simplified block diagram of an example of a processing system 100. In the illustrated example, the processing system 100 is implemented within an integrated circuit device 105 comprising at least one die within a single integrated circuit package. The processing system 100 comprises one or more processing modules, such as central processing unit (CPU) 110. The CPU 110 comprises one or more processing components 115, for example such as arithmetic and/or logic units (ALUs). The CPU 110 further comprises one or more register files 120. Other components of the processing system 100 may additionally and/or alternatively comprise register files 120, such as a crossbar component 130, accelerator hardware 140, etc.

Figure 2:
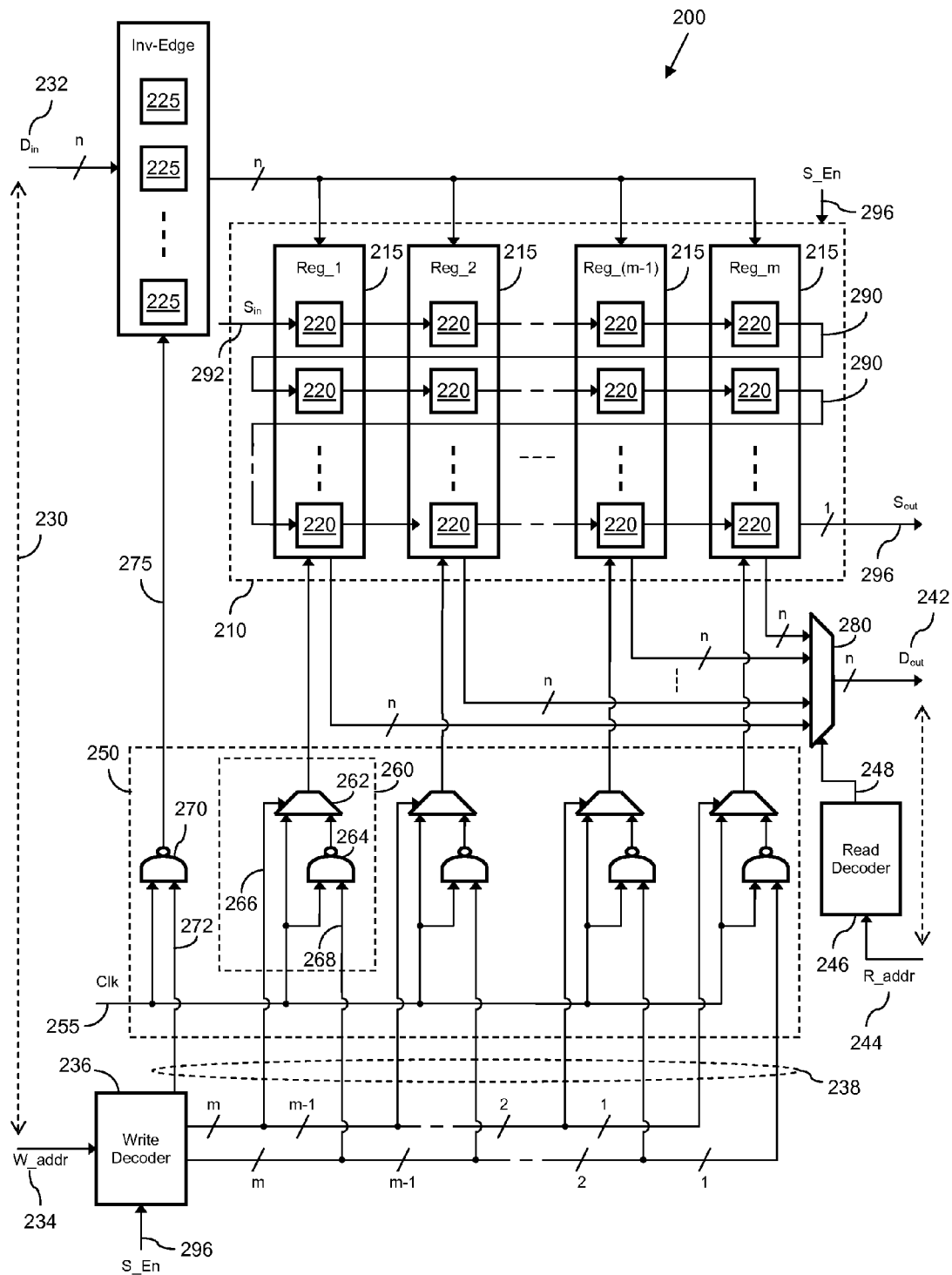
FIGS. 2 and 3 illustrate simplified block diagrams of an example of a register file module.

Referring now to FIG. 2, there is illustrated a simplified block diagram of an example of a register file module 200, such as with which one or more of the register files 120 illustrated in FIG. 1 may be implemented. The register file module 200 illustrated in FIG. 2 comprises at least one register array 210. The register array 210 comprises a plurality or registers 215, and in particular in the illustrated example comprises m registers, denoted Reg_1 to Reg_m. Each register comprises a plurality of latch devices 220 individually arranged to provide memory bit-cells. As is well known in the art, such a latch device 220 is arranged to receive at a first input thereof a data signal, and at a second input thereof an enable/clock signal, and is arranged to comprise a transparent state upon the enable/clock signal comprising a first logical state whereby the latch device 220 outputs a logical state corresponding to that of the data signal received at the first input thereof, and to comprise a latched state upon the enable/clock signal comprising a second logical state whereby the latch device 220 latches and maintains the logical state at its output. In the illustrated example, each register 215 comprises n latch device 220.

The register file module 200 further comprises at least one write port 230 via which data ($D_{in}$) 232 to be stored within the register file module 200 is received, and at least one read port 240 via which data ($D_{out}$) 242 stored within the register file module 200 may be read. The register file module 200 comprises a write decoder 236 arranged to receive, via the write port 230, and decode a write address 234 for a register 215 within which data ($D_{in}$) 232 is to be stored within the register file module 200. In the illustrated example, the write decoder 236 is further arranged to output control signals 238 at least partly in accordance with a received and decoded write address 234. The register file module 200 further comprises a read decode 246 arranged to receive, via the read port 240, and decode a read address 244 for a register 215 within the register file module 200 from which data ($D_{out}$) 242 stored within the register file module 200 is to be read.

The register file module 200 further comprises a clock control component 250 arranged to receive a clock signal 255, and to propagate the received clock signal 255 to the latch devices 220 within the registers 215 in accordance with the control signals 238 output by, in the illustrated example, the write decoder 236. In particular in the illustrated example, the clock control component 250 comprises a configurable clock path for each register 215, such as the clock path 252, via which the clock signal 225 may be propagated to the respective register 215. In the illustrated example such clock path 252 comprises a multiplexer 262 and a NAND gate 264. The multiplexer 262 comprises a first input arranged to receive the clock signal 255 and a second input arranged to receive an output signal of the NAND gate 264. The multiplexer 262 is controllable, via a control signal 266 output by the write decoder 236, to selectively output a register clock signal 265 comprising one of the signals received at its inputs. The NAND gate 264 comprises a first input arranged to receive the clock signal 255 and a second input arranged to receive a further control signal 268 output by the write decoder 236. In this manner, if the control signal 268 comprises a logical state of '0', the NAND gate 264 will output a logical state of '1', irrespective of the logical state of the clock signal 255. Conversely, if the control signal 268 comprises a logical state of '1', the NAND gate 264 will output the opposite logical state to that of the clock signal 255. As such, if the control signal 268 comprises a logical state of '1', the NAND gate 264 will output an inverted clock signal.

Accordingly, in the illustrated example the write decoder 236 is able to individually configure, via the control signals 280 output thereby, a clock path 260 for each register 215 within the register array 210 to output one of:
- a non-inverted form of the clock signal 255, by configuring the respective multiplexer 262 to output the clock signal 255 received at its first input;
- an inverted form of the clock signal 255, by configuring the respective multiplexer 262 to output the signal received at its second input from the NAND gate 264, and to configure the control signal 268 provided to the second input of the NAND gate 264 to comprise a logical state of '1'; and
- a constant (gated) logical state of '1', by configuring the respective multiplexer 262 to output the signal received at its second input from the NAND gate 264, and to configure the control signal 268 provided to the second input of the NAND gate 264 to comprise a logical state of '0'.

The register file module 200 is configurable to operate in a functional operating mode, whereby data ($D_{in}$) 232 to be stored within the register file module 200 is received via the write port 230 and provided to each of the registers 215 within the register array 210 (via inverse-edge latch devices 225 in the illustrated example as described in greater detail below). In the functional operating mode, the write decoder 236 and clock control component 250 are arranged to selectively propagate the clock signal 255 to a register 215 within the register array 210 to which the write address 234 relates during the respective write cycle, and to gate the clock signal to the other registers 215 within the register array 210. In this manner, the latch devices 220 within the registers 215 to which the clock signal is gated may be held within a latched state, preventing the received data ($D_{in}$) 232 to be stored within the register file module 200 from affecting data already stored within those registers 215. Conversely, by propagating the clock signal 255 to the latches within the register 215 to which the write address 234 relates, the latches within that register may be transitioned from a latched state to a transparent state and back to a latched state during the write cycle. In this manner, the data ($D_{in}$) 232 to be stored within the register file module 200 will be sampled and latched by the latch devices 220 within the register 215 to which the write address 234 relates, and thus stored.

In the illustrated example, the register file module 200 further comprises inverse-edge latch devices 225 operably coupled between the write port 230 and the register array 210. As mentioned above, data ($D_{in}$) 232 to be stored within the register file module 200 is received via the write port 230 and provided to the registers 215 within the register array 210 via the inverse-edge latch devices 225; one inverse-edge latch device 225 for each bit of the data ($D_{in}$) 232 to be stored. Thus, in the illustrated example, n such inverse-edge latch devices 225 are operably coupled in parallel between the write port 230 and the registers 215. The clock control component 150 is arranged to propagate an inverted form of the clock signal 250 to the inverse-edge latch devices 225 such that the inverse-edge latch devices 225 comprise an opposing state (transparent or latched) to that of clocked latch devices 220 (i.e. latch devices 220 to which the clock signal 250 is propagated) within the register array 210 in accordance with the clock signal 250. In the illustrated example, this is implemented by way of a NAND gate 270, which in the illustrated example forms a part of the clock control component 250. The NAND gate 270 comprises a first input arranged to receive the clock signal 255 and a second input arranged to receive a control signal 272 output by the write decoder 236. In this manner, if the control signal 272 comprises a logical state of '0', the NAND gate 270 will output a logical state of '1', irrespective of the logical state of the clock signal 255. Conversely, if the control signal 272 comprises a logical state of '1', the NAND gate 270 will output the opposite logical state to that of the clock signal 255. As such, if the control signal 272 comprises a logical state of '1', the NAND gate 270 will output an inverted clock signal 275, which is provided to the inverse-edge latch devices 225.

Advantageously, by providing the data ($D_{in}$) 232 to be stored within the register file module 200 to each of the registers 215 within the register array 210 via the inverse-edge latch devices 225, the inverse-edge latch devices 225 and the latch devices 220 within the clock register 215 within which the received data ($D_{in}$) 232 is to be stored together form a flip-flop structure. In this manner, hold timing of received data is provided by the inverse-edge latch devices 225. Furthermore, by providing the inverse-edge latch devices 225 between the write port 230 and the register array 210, only a single 'column' of inverse-edge latch devices 225 is required to provide such hold timing for all the latched-based registers 215 within the register array 210.

For completeness, in the functional operating mode, the read decoder 246 is arranged to receive a read address 244 received via the read port 240, and to output a read control signal 248 arranged to selectively output, via a multiplexer 280, data stored within a register 215 to which the read address 244 relates.

The register file module 200 is further configurable to operate in a scan mode. In the scan mode, latch devices 220 within the register array 210 may be arranged into one or more scan chains, whereby in the or each scan chain an output of each latch device 220 therein (with the exception of a last latch device 220 in the scan chain) is operably coupled to an input of a next sequential latch device 220 in the scan chain. In this manner, a scan input signal received at an input of a first latch in the scan chain may be propagated from one latch to the next through the scan chain.

In the illustrated example, when the register file module 200 is configured to operate in the scan mode, latch devices 220 within the register array 210 are laterally coupled (relative to the registers 215) into a single scan chain, illustrated generally by the arrows 290, whereby an output of a first latch device 220 of the first register Reg_1 215 is coupled to an input of the first latch device 220 of the second register Reg_2 215, etc. At the end of a lateral row of latch devices 220, the scan chain loops back to the next latch device 220 in the first register Reg_1 215. For example, the output of the first latch device 220 in the last register Reg_m 215 is operably coupled to the input of the second latch device 220 in the first register Reg_1 215. A scan input signal ($S_{in}$) 292 is operably coupled to an input of the first latch device 220 of the first register Reg_1 215, whilst a scan output signal ($S_{out}$) 294 is output from an output of the last ($n^{th}$) latch device 220 of the last register Reg_m 215.

Figure 3:
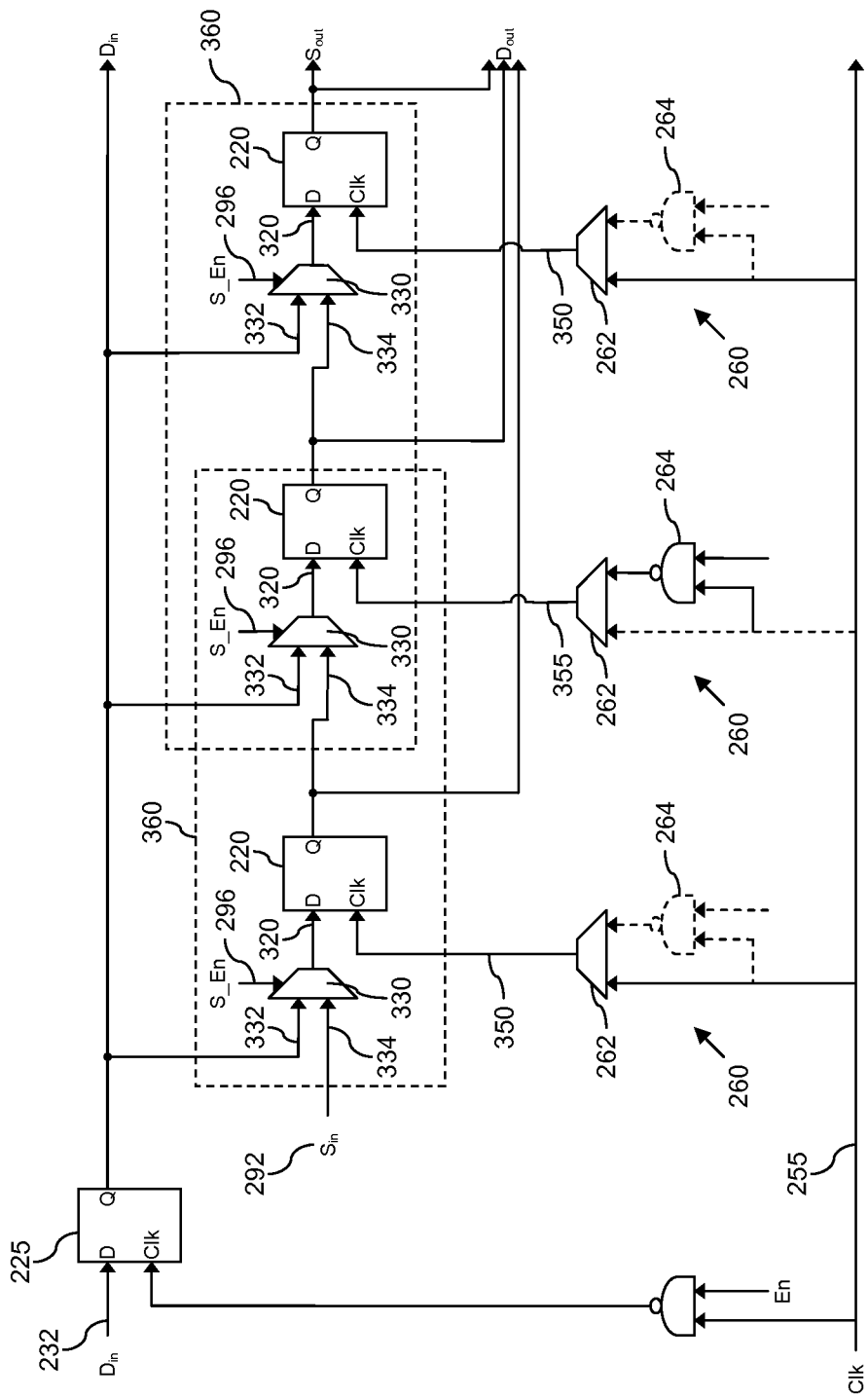

Such a scan mode may be enabled by way of a scan enable signal (S_En) 296 provided to, in the illustrated example, the register array 210 and the write decoder 296. For example, and as illustrated in FIG. 3, a data input 320 of each latch device 220 within the register array 210 may be operably coupled to an output of a multiplexer 330. A first input 332 of each such multiplexer 330 may be arranged to receive a respective bit of data ($D_{in}$) 232 to be stored within the register file module 200, received via the write port 230 and inverse-edge latch devices 225. A second input 334 of each such multiplexer 330 may be arranged to receive a respective scan input signal. For example, the second input 334 of the respective multiplexer 330 of the first latch device 220 of the first register Reg_1 215 may be arranged to receive the initial scan input signal ($S_{in}$) 292, whilst the second input 334 of the respective multiplexer 330 of each other latch device 220 may be operably coupled to the output of the preceding latch device 220 in the scan chain 290. The scan enable signal (S_En) 296 may thus be provided to the multiplexers 330 to selective configure the input of each latch device 220 between receiving a respective bit of data ($D_{in}$) 232 to be stored within the register file module 200, and receiving a respective scan input signal.

In such a gated latch implementation, input signal changes cause immediate changes in output when the latch devices 220 enter a transparent state in response to a clock signal transition. As such, when several latches follow each other, such as in a scan chain configuration, using the same clock signal, input signals can propagate through all of the latches at once (e.g. within a single clock cycle). As will be appreciated, this is undesirable when such a scan chain configuration is to be used to implement design for test functionality.

In the example illustrated in FIG. 2, when the register file module 200 is configured to operate in the scan mode, the clock control component 250 is arranged to propagate the clock signal 255 to the latch devices 220 within the register array 210, whereby alternate latch devices 220 receive an inverted form of the clock signal 255 such that a first latch within each adjacent pair of latch devices 220 within the scan chain 290 receives a non-inverted form of the clock signal 250 whilst the second latch within each adjacent pair of latch devices 220 within the scan chain 290 receives an inverted form of the clock signal 250. For example, and as illustrated in FIG. 3, the write decoder 236 may be arranged to configure, via the control signals 280 output thereby, a clock path 260 for, say, each odd numbered register 215 within the register array 210 to output a non-inverted form of the clock signal 350, by configuring the respective multiplexer 262 to output the clock signal 255 received at its first input, and a clock path 260 for each even numbered register 215 within the register array 210 to output an inverted form of the clock signal 355, by configuring the respective multiplexer 262 to output the signal received at its second input from the NAND gate 264, and to configure the control signal 268 provided to the second input of the NAND gate 264 to comprise a logical state of '1'. In this manner, and as illustrated in FIG. 3, adjacent latch devices 220 within the scan chain will receive clock signals clock signals output phase by half a clock cycle, effectively creating a flip-flop structure, as illustrated at 360 in FIG. 3, between each pair of adjacent latch devices 220.

Figure 4:
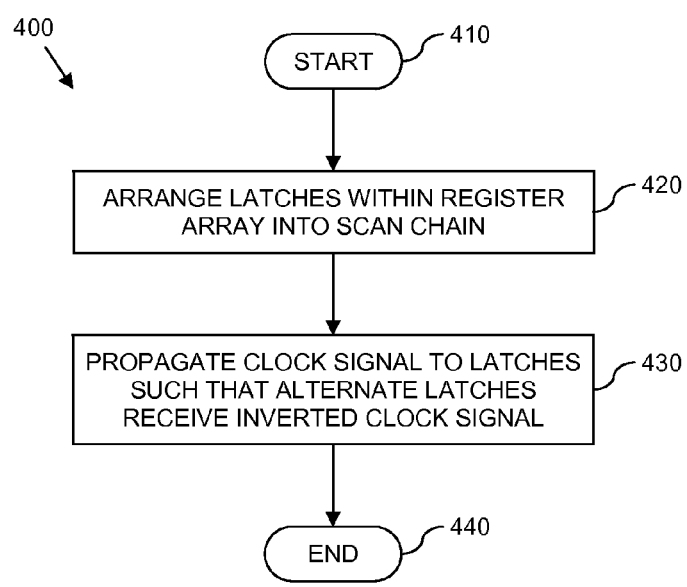
FIG. 4 illustrates a simplified flowchart of an example of a method of enabling scan chain functionality within a register array.

Referring now to FIG. 4, there is illustrated a simplified flowchart 400 of an example of a method of enabling scan chain functionality within a register array, such as may be implemented within the register file module 200 of FIGS. 2 and 3. Specifically, the flowchart 400 illustrates a method of enabling scan chain functionality within a register array comprising a plurality of latch devices arranged to individually provide memory bit-cells when the register array is configured to operate in a first, functional operating mode. The method starts at 410, and moves on to 420 where the latch devices within the register array are arranged into at least one scan chain. Next, at 430, a clock signal is propagated to the latch devices within the register array such that alternate latch devices within the at least one scan chain receive an inverted form of the clock signal. The method then ends, at 440.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A device comprising:
   an array of latch devices arranged as a plurality of rows and a plurality of columns including a first column, a second column, a first row, and a second row of latch devices, the array of latch devices configured to operate in one of a functional mode wherein each latch device of the array of latch devices provides an addressable memory bit cell, and a scan mode wherein each latch device of the array of latch devices is interconnected to provide at least one scan chain;
   an additional column of latch devices including a latch device corresponding to each row of the array of latch devices; and
   a clock control component to provide a first clock signal and a second clock signal, the second clock signal an inverted form of the first clock signal, the clock control component to:
      if the array of latch devices is operating in the functional mode, provide the first clock signal to each latch included in a selected one of the first column and the second column of latch devices, and provide the second clock signal to each latch in the additional column of latch devices; and
      if the array of latch devices is operating in the scan mode, provide the first clock signal to the first column of latch devices and provide the second clock signal to the second column of latch devices.

2. The device of claim 1, wherein the clock control component is further to provide the first clock signal to the selected one of the first and second column of latch device based on a decoded register address if the array of latch devices is operating in the functional mode.

3. The device of claim 1, wherein latch devices at the first column of latch devices provides a register, the register selected by a decoded register address if the array of latch devices is operating in the functional mode.

4. The device of claim 3, wherein an output of a first latch at the additional column of latch devices corresponding to the first row of latch devices is coupled to an input of a second latch device at the first column of latch devices if the decoded register address selects the first column of latch devices.

5. The device of claim 3, further comprising:
   a write port to receive data to be stored at the selected register, the write port coupled to an input of the first latch at the additional column of latch devices.

6. The device of claim 3, wherein an output of a first latch at the additional column of latch devices corresponding to the first row of latch devices is coupled to a second latch device at the second column of latch devices if the decoded register address selects the second column of latch devices.

7. The device of claim 1, wherein the first column of latch devices is physically adjacent to the second column of latch devices and physically adjacent to the additional column of latch devices.

8. The device of claim 1, wherein the first row of latch devices includes a first latch device and a second latch device adjacent to the first latch, and wherein the clock control component is further to, if operating in the scan mode, provide the first clock signal to the first latch device and provide the second clock signal to the second latch device.

9. The device of claim 1, further comprising:
a read decoder to select one column of the plurality of columns if the array of latch devices is operating in the functional mode, the selecting based on a read address, each latch of selected column corresponding to a respective bit of a register identified by the read address.

10. The device of claim 1, further comprising:
a write decoder to select one column of the plurality of columns if the array of latch devices is operating in the functional mode, the selecting based on a write address, each latch of selected column corresponding to a respective bit of a register identified by the write address.

11. A method comprising:
determining whether an array of latch devices is operating in a functional mode wherein each latch device of the array of latch devices provides an addressable memory bit cell or a scan mode wherein each latch device of the array of latch devices is interconnected to provide at least one scan chain, the array of latch devices arranged as a plurality of rows and a plurality of columns including a first column, a second column, a first row, and a second row of latch devices;
if the array of latch devices is operating in the functional mode, providing a first clock signal to each latch included in a selected one of the columns of latch devices, and providing a second clock signal that is an inverted form of the first clock signal to each latch in an additional column of latch devices, the additional column of latch devices including a latch device corresponding to each row of the array of latch devices; and
if the array of latch devices is operating in the scan mode, providing the first clock signal to the first column of latch devices and providing the second clock signal to the second column of latch devices.

12. The method of claim 11, wherein:
each column of latch devices of the array of latch devices provides a register; and
if the array of latch devices is operating in the functional mode, determining the selected one of the plurality of columns of latch devices based on a decoded register address.

13. The method of claim 12, wherein unselected columns of latch devices do not receive the first clock signal or the second clock signal.

14. The method of claim 12, further comprising:
receiving data to be stored at the selected register at a write port, the write port coupled to an input of the first latch at the additional column of latch devices.

15. The method of claim 12, wherein an output of a first latch at the additional column of latch devices corresponding to the first row of latch devices is coupled to an input of a second latch device at the first column of latch devices if the decoded register address selects the first column of latch devices.

16. The method of claim 12, wherein an output of a first latch at the additional column of latch devices corresponding to the first row of latch devices is coupled to an input of a second latch device at the second column of latch devices if the decoded register address selects the second column of latch devices.

17. The method of claim 11, wherein an output of a first latch at the first row of latch devices is coupled to an input of a second latch device at the first row of latch devices if the array of latch devices is operating in the scan mode.

18. The method of claim 11, wherein the first row of latch devices includes a first latch device and a second latch device adjacent to the first latch, the method further comprising, if operating in the scan mode, providing the first clock signal to the first latch device and providing the second clock signal to the second latch device.

19. A register file comprising:
a first column of latch devices to provide a first register;
a second column of latch devices to provide a second register;
a third column of latch devices;
a first row of latch devices;
a second row of latch devices; and
a clock control component to provide a first clock signal and a second clock signal, the second clock signal an inverted form of the first clock signal, the clock control component to:
if the register file is operating in a functional mode wherein each latch device of the first and second columns of latch devices provides an addressable memory bit cell, provide the first clock signal to each latch included in a selected one of the first column and the second column of latch devices, and provide the second clock signal to each latch in the third column of latch devices, the unselected one of the first and second column to not receive the first clock signal or the second clock signal; and
if the register file is operating in a scan mode wherein each latch device of the first and second columns is interconnected to provide a first scan chain, provide the first clock signal to the first column of latch devices and provide the second clock signal to the second column of latch devices.

20. The register file of claim 19, further comprising:
a write port to receive data to be stored at the selected column of latch devices if the register file is operating in the functional mode, the write port coupled to an input of a first latch device at the third column of latch devices, and an output of the first latch at the third column of latch devices coupled to an input of a second latch at the selected column of latch devices.

* * * * *